(12) United States Patent
Kau

(10) Patent No.: US 7,751,226 B2
(45) Date of Patent: Jul. 6, 2010

(54) READING PHASE CHANGE MEMORIES WITH SELECT DEVICES

(75) Inventor: Derchang Kau, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 11/880,934

(22) Filed: Jul. 25, 2007

(65) Prior Publication Data

US 2009/0027951 A1    Jan. 29, 2009

(51) Int. Cl.
*G11C 11/00* (2006.01)
(52) U.S. Cl. .................. 365/148; 365/189.15
(58) Field of Classification Search .......... 365/148, 365/189.15
See application file for complete search history.

(56) References Cited

U.S. PATENT DOCUMENTS

| 7,259,982 | B2 * | 8/2007 | Johnson ............... 365/163 |
| 7,388,775 | B2 * | 6/2008 | Bedeschi et al. ....... 365/163 |
| 2006/0227590 | A1 * | 10/2006 | Parkinson ............ 365/148 |

* cited by examiner

*Primary Examiner*—Hoai V Ho
(74) *Attorney, Agent, or Firm*—Trop, Pruner & Hu, P.C.

(57) ABSTRACT

A phase change memory including a threshold device, such as an ovonic threshold switch, and a storage device may be read. Reading the cell may involve applying a first voltage to a selected cell and then a second voltage, lower than the first voltage. The first voltage may be sufficient to threshold the ovonic threshold switch if the storage device is in the set state.

17 Claims, 4 Drawing Sheets

READING PHASE CHANGE MEMORIES WITH SELECT DEVICES

BACKGROUND

This relates generally to phase change memories using phase change alloys including chalcogenide and pnictide alloys, collectively called lone-pair semiconductors.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

Figure 1:
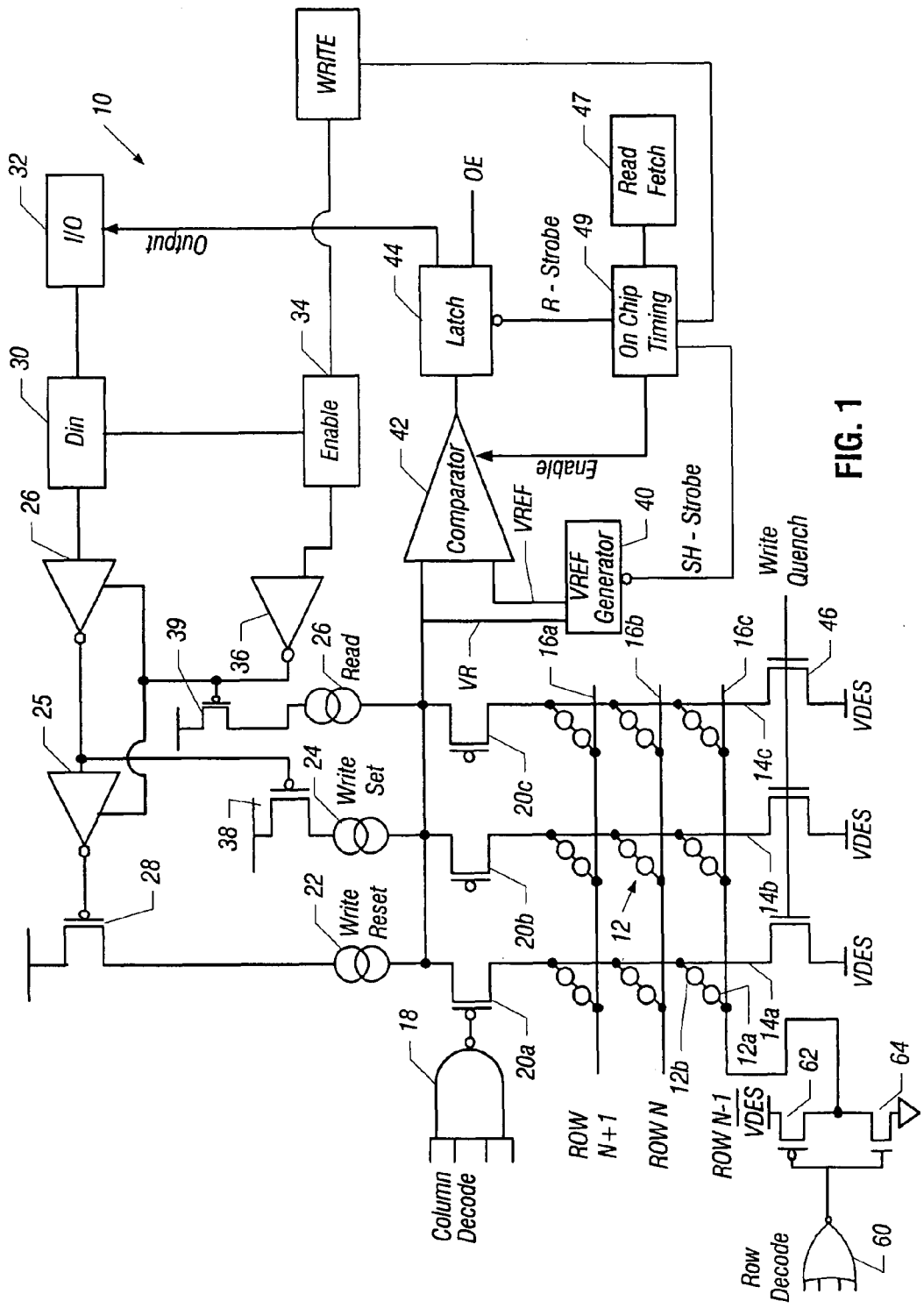
FIG. 1 is a schematic depiction of one embodiment of the present invention.

Referring to FIG. 1, a memory 10 may include an array of memory cells 12 arranged in rows 16 and columns 14 in accordance with one embodiment of the present invention. While a relatively small array is illustrated, the present invention is in no way limited to any particular size of an array. While the terms "rows" and "columns" are used herein, they are merely meant to be illustrative and are not limiting with respect to the type and style of the sensed array.

The cell 12 may be any memory cell including a phase change memory cell. Examples of phase change memory cells include those using a chalcogenide memory element 12b and threshold device 12a. One select or threshold device is an ovonic threshold switch that can be made of a chalcogenide alloy that does not exhibit an amorphous to crystalline phase change and which undergoes rapid, electric field initiated change in conductivity that persists so long as a holding current is present.

In the case illustrated, a cell 12 includes an access, select, or threshold device 12a, as well as a storage device 12b which actually stores a bit of data. A set of transistors 46 may be located on the columns 14 in order to enable write quenching and deselecting, and precharging to a voltage, which may be different than the deselect voltage $V_{DES}$ by multiplexing to a different voltage.

A column decoder 18 receives address signals to select the desired column 14 using transistors 20 associated with each column. A reset write current source 22, a set write current source 24, and a read current source 26 are coupled at a common node at their outputs to supply current to the selected column 14, such as the column 14b as determined by which column transistor 20 is on. Of course, the current sources in actual practice would be coupled to selected columns as needed in response to commands from an external memory user such as a processor (not shown), at the address provided by the external user.

A row decoder 60 receives address signals to select the desired row. The output of the decoder 60 passes through an inverter made up of transistors 62 and 64 to the selected row 16.

Transistors 28, 38 and 39 are on/off switches that provide the desired current generated by the current sources 22, 24 or 26, to the selected column 14. A NOR gate enable circuit 36 with an input from Enable 34 provides a control circuit for the transistor 39 and thus for the read current source 26 and also may provide an enable signal for Din gates 25 and 26 to enable one of the two gates for writing to the user selected state. The gates 25 and 26 are gated on by an enable circuit 36 and receive a Din 30 signal as another input to select which write current source is activated. An input/output (I/O) control 32 is coupled to the Din circuit 30. Enable 34 is controlled by the write input to the chip. Write input or read fetch 47 requests a read cycle from the on-chip timing block 49, which starts the on-chip timing and sequentially enables the comparator 42 and latches the data for the I/O 32 for a read, or enables Din gate 25 and 26 (and disable gate 36) if a write and produces a current pulse of appropriate amplitude to write a reset and less amplitude to write a set bit. Alternatively, the current amplitude of both reset and set bits may be adequate for reset, with the bit written to reset if the trailing edge is fast (e.g. less than 10 nsec) or slow (e.g. greater than 100 nsec.) if the set state is desired.

For reading, a comparator 42 is enabled by the on-chip timing 49 (in response to a read fetch request 47) and receives one input from a selected column (e.g. column 14c) being read. The comparator 42 and reference voltage generator 40 may be provided on each column 14 in one embodiment, but as shown, the generator 40 may be shared across an array or block of row or column lines to reduce comparator 42 related layout area.

The reference voltage generator 40 receives a voltage VR from the column 14 and outputs a voltage VREF to the comparator 42. The reference generator 40 is strobed by a sample and hold (SH) strobe from the on-chip timing block 49. The output from the comparator 42 to a data output latch 44 provides an output enable (OE) signal as an option which at least indicates when the output can be driven (ready/busy), though usually OE is furnished by a separate external processor to enable the output driver. The output signal from the latch 44 is controlled by a read (R) strobe from the on-chip timing block 49.

The set state corresponds to a lower resistance value and the reset state corresponds to a higher resistance value in the storage device 12b. Thus, the reference voltage level is between the reset and set levels, at the instance of time when read data is latched.

Figure 3:
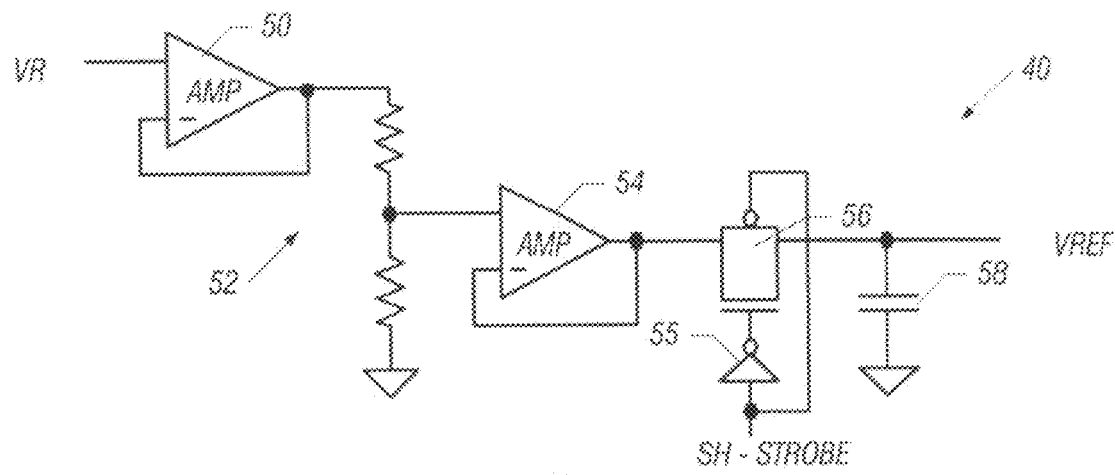
FIG. 3 is a schematic of the reference generation of FIG. 1 in one embodiment.

Referring to FIG. 3, the generator 40 receives a reference signal voltage VR from the selected column 14. That voltage is buffered by a first amplifier 50 and a second amplifier 54. The amplifier 54 receives its voltage from voltage divider 52. While a resistor divider is shown, other voltage dividers may be used including a capacitor divider for reduced power and better layout efficiency. The voltage divider 52 may provide a 0.25 volt offset from the actual column voltage in one embodiment.

A pass transistor 56 is controlled by the sample and hold (SH) strobe signal. The transistors 56 conduct when the sample and hold (SH) signal turns on the transistors. The SH strobe signal determines when to latch the reference voltage level, by turning off the transistors 56. The signal from the pass transistor 56 may then be stored for subsequent comparison for a period of time in a capacitor 58. In one embodiment, the capacitor 58 may be 0.001 microfarads, storing the reference voltage signal for about 200 nanoseconds for example or whatever time is necessary to allow the column to change for further comparison to this stored level. This same function can also be done by a more sophisticated sample and hold.

In one embodiment, the phase change material used in the storage device 12b may be suitable for non-volatile memory data storage. The phase change material may be a material having electrical properties (e.g., resistance) that may be changed through the application of energy such as, for example, heat, light, voltage potential, or electrical current.

Examples of phase change materials may include a chalcogenide material. A chalcogenide material may be a material that includes at least one element from column VI of the periodic table or may be a material that includes one or more of the chalcogen elements, e.g., any of the elements of tellurium, sulfur, or selenium. Chalcogenide materials may be non-volatile memory materials that may be used to store information that is retained even after electrical power is removed.

In one embodiment, the phase change material may be chalcogenide element composition from the class of tellurium-germanium-antimony ($Te_xGe_ySb_z$) material or a GeSbTe alloy, such as type 2,2,5 although the scope of the present invention is not limited to just these materials.

In one embodiment, if the memory material is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state.

Programming of the memory material to alter the state or phase of the material may be accomplished by selecting the cell through applying a relatively low voltage, such as zero volts to the line 16 and a current into the selected column 14, from current source 22 (to reset to a higher resistance) or 24 (a lower current or slower trailing edge to reset to a lower resistance) thereby generating a voltage potential across the memory material. An electrical current may flow through a portion of the memory material in response to the applied voltage potentials, and may result in heating of the memory material. This controlled heating and subsequent controlled cooling may alter the memory state or phase of the memory material.

Altering the phase or state of the memory material may alter an electrical characteristic of the memory material. For example, resistance of the material may be altered by altering the phase of the memory material. Either all or a portion of the phase change memory material may be altered during the writing pulse (i.e. only a portion/region of sensing device 12b adjacent to either the top or bottom electrode may be phase changed during the write operation). In one embodiment, primarily the portion of memory material that undergoes phase change is the region that is adjacent to the smaller electrode contacting the storage device 12b. The memory material may also be referred to as a programmable resistive material or simply a programmable resistance material or memory.

In one embodiment, a voltage pulse with a potential difference of about 1.5 volts may be applied across a portion of the memory material by applying about 0 volts to a line 16 and a current of about 2 ma from write current source 22 into the selected line 14. For example, the voltage on the selected line 14 is positive relative to the selected line 16, but the cell or voltages may also be reversed. A current flowing through the memory material in response to the applied voltage potentials may result in heating of the memory material. This heating and subsequent controlled cooling, determined by the write current pulse trailing edge rate, may alter the memory state or phase of the material after it is cooled, from higher to lower resistance or lower to higher resistance, or simply to rewrite the existing state to reinforce it.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

The information stored in memory material may be read by measuring the resistance of the memory material. As an example, a read current may be provided to the memory material using the selected row and column and a resulting read voltage across the memory material may be compared against a reference voltage using, for example, the sense amplifier 42. The resulting read voltage on the column may be proportional to the resistance exhibited by the selected memory storage device 12b when a read current is forced into the column.

Figure 2A:
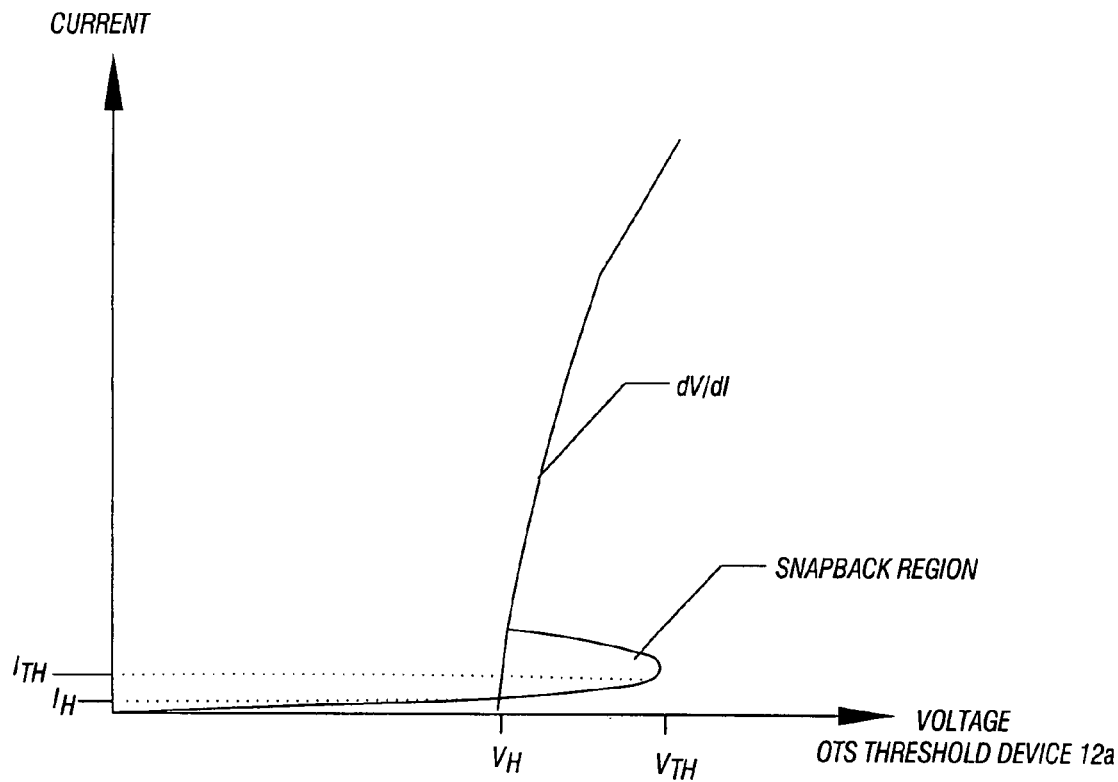
FIG. 2a is a graph of current versus voltage for an ovonic threshold switch depicted in FIG. 1 in accordance with one embodiment.

In a low voltage or low field regime "L" in FIG. 2A, the device 12a is off and may exhibit very high resistance in some embodiments. The off resistance can, for example, range from preferably greater than 50,000 ohms to be greater than 10 gigaohms at a bias of about half the threshold voltage. The device 12a may remain in its off state until a voltage across it exceeds a threshold voltage ($V_{TH}$) or until a current exceeding a threshold current ($I_{TH}$) switches the device 12a to a highly conductive, low or dynamic resistance "on" state called dV/dI region that, when extrapolated, will intercept the X axis at the holding voltage $V_H$(OTS), as indicated in FIG. 2A. After turn-on, the voltage across the device 12a drops to a lower voltage, called the holding voltage $V_H$, and remains very close to this holding voltage almost regardless of the column current since the dynamic on resistance is relatively low, frequently less than 1000 ohms (in series with the threshold device 12a holding voltage).

After passing through the snapback region, in the on state, the device 12a voltage drop remains close to the holding voltage as the current passing through the device is increased, even if at a relatively high, read or write current level. Above a relatively high current level (density) the device remains on but displays a finite and increasing dynamic resistance, with the voltage drop across 12a increasing with increasing current due to the IR drop across the dynamic resistance.

The device 12a may remain on until the current through the device 12a is reduced below a characteristic holding current value that is dependent on the type and area of the material, and may be impacted by the top and bottom electrodes utilized to form the device 12a, as well as the magnitude of capacitance on the column line.

In some embodiments of the present invention, the threshold device 12a does not change phase. It remains permanently amorphous and its current-voltage characteristics may remain the same throughout its operating life.

As an example, for a 0.5 micrometer diameter device 12a, with a thickness of approximately 750 Angstroms, formed of TeAsGeSSe having respective atomic percents of 16/13/15/1/55, the holding current may be on the order of 0.1 to 1 micro-amps (uA) in one embodiment. Below this holding current, the device 12a turns off and returns to the high resistance regime at low voltage, low field L in FIG. 2A. The holding current may be altered by changing process variables, such as the top and bottom electrode material and the chalcogenide material. The device 12a may provide high "on current" for a given area of device compared to conventional access devices such as metal oxide semiconductor field effect transistors or bipolar junction transistors or semiconductor diodes. However, such other select devices may also be used in some embodiments.

Figure 2B:
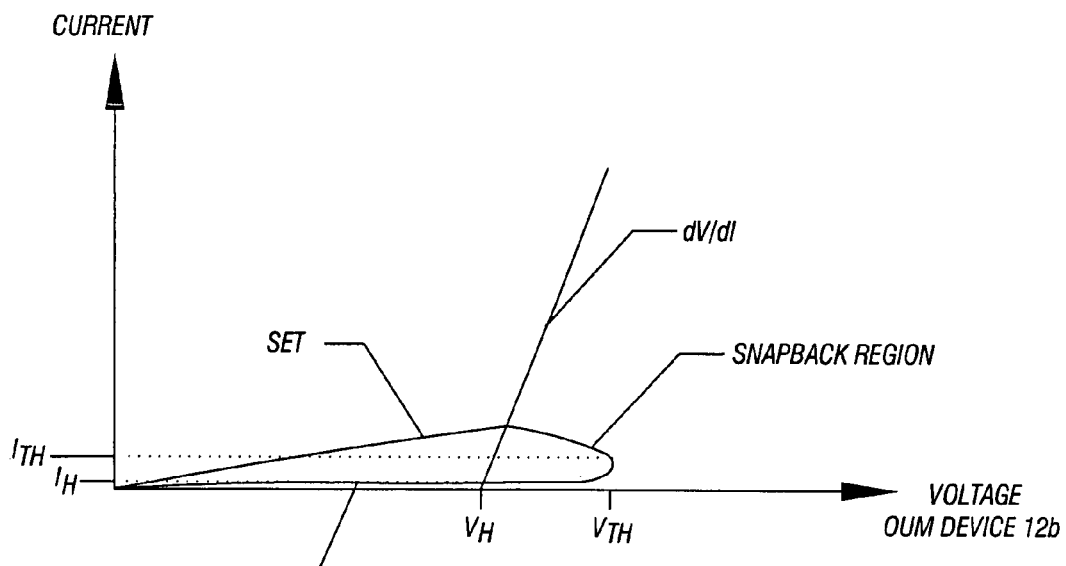
FIG. 2b is a graph of current versus voltage for the memory element depicted in FIG. 1 in accordance with one embodiment.

As shown in FIG. 2B, the set bit is relatively low resistance beginning at the origin and sloping up to intercept the snapback of the reset bit, where the dynamic resistance tends to be lower for increasing current.

Figure 4:
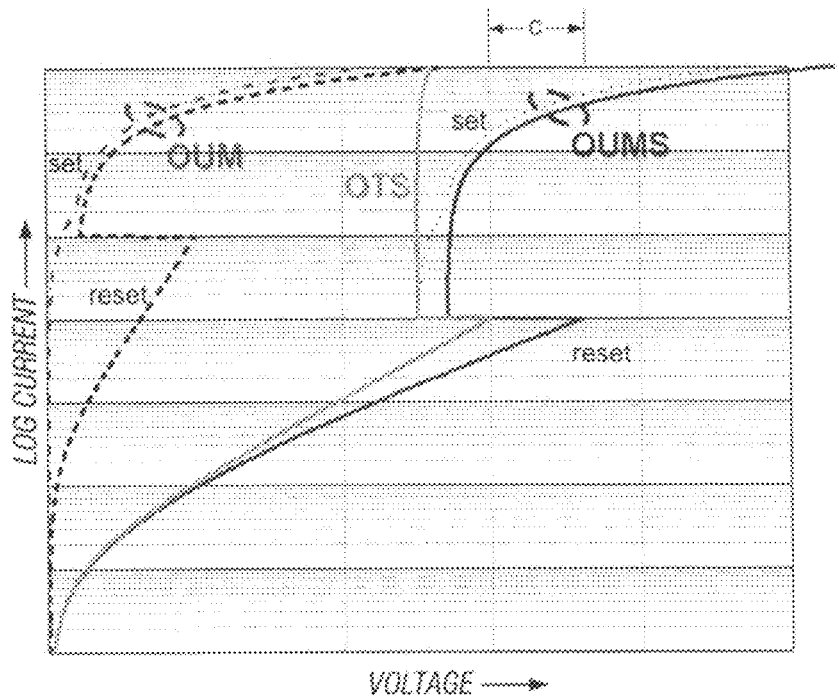
FIG. 4 is a graph of voltage versus time for a selected column, a deselected column, a selected row, and a deselected row during selection and read phases in accordance with one embodiment.

Referring to FIG. 4, in one embodiment, reading may be implemented by turning on the ovonic threshold switch 12a. This may involve applying a voltage on a selected column that is sufficient to exceed the threshold voltage of the ovonic threshold switch 12a plus the drop across the untriggered storage device 12b. In FIG. 4 this voltage may be the voltage indicated at A, which is a relatively higher voltage sufficient to cause the switch 12a to threshold if the storage device 12b is in the set state. Then the voltage may be dropped to a lower voltage, indicated at B. By dropping to a lower voltage, the amount of leakage that occurs may be reduced, especially if the unselected row lines are reduced correspondingly.

In one embodiment, the second lower voltage B corresponds to the holding voltage of the ovonic threshold switch 12a. In some cases, the holding voltage may be relatively invariant and may be well known in advance. Therefore, it is a relatively simple matter to apply the known holding voltage to the unselected row lines at the same time that the holding voltage is applied to the selected bitline. In other words, initially, the higher voltage sufficient to cause the thresholding of the switch 12a may be applied to both the selected bitline and the deselected row lines. Then both the selected bitline and the deselected row lines may be dropped by their respective read current sources 26 to a holding voltage of the threshold switch 12a.

At the same time, a deselected column may be exposed to the voltage $V_{CD}$, as shown in FIG. 3, a selected row may be exposed to the voltage $V_{RS}$, as shown in FIG. 3, and the deselected row follows the pattern shown at $V_{RD}$ in FIG. 3.

In a first phase, labeled select phase in FIG. 3, the higher voltage A is applied and in a second phase labeled the read phase, when the read actually occurs and data is actually outputted to the comparator 42, the lower voltage B corresponding to the ovonic threshold switch holding voltage may be applied.

Basically, in the above procedure, it is presumed that the selected cell is a set cell. However, if the selected cell is a reset cell under either the higher voltage or the lower voltage, no read current passes through the column and reading can proceed normally.

Once the switch 12a has thresholded, it normally stays thresholded, even at the holding voltage. Thus, the lower voltage can be used which has less adverse effect on leakage current.

Figure 5:
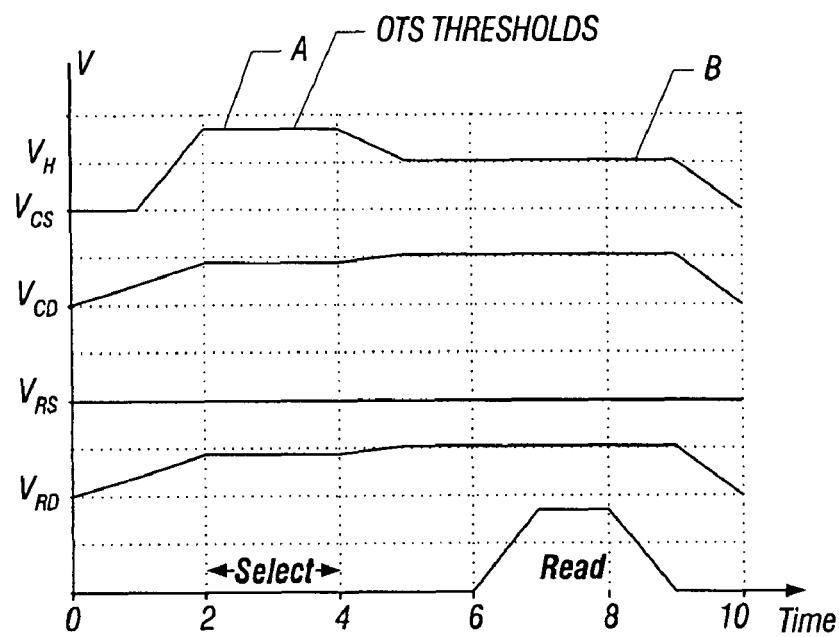
FIG. 5 is a graph of log current versus voltage for one embodiment of the present invention.

Referring next to FIG. 5, a graph of log current versus voltage is shown for an illustrative memory cell 12. The characteristics of the storage device 12b are indicated adjacent to the letters OUM. A characteristic of a set storage device 12b is shown proximate thereto in lighter dashes and the reset characteristic is shown in darker dashes.

Moving to the right in FIG. 5, next is shown the characteristic for an ovonic threshold switch (OTS) threshold device 12a.

Finally, the characteristics of the memory cell 12, indicated as OUMS, are depicted for both the set state (shown in dotted lines) and the reset state (shown in solid lines).

The zone C is the operating zone, for the voltage A, in accordance with some embodiments of the present invention. It is a voltage higher than the voltage sufficient to trigger the threshold device 12a when the storage device 12b is in the set state, but not high enough to trigger the storage device 12b when the storage device 12b is in the reset state.

In some embodiments of the present invention, it may be advantageous to match the selected column bias and the deselected row bias. This voltage matching may reduce array leakage. Thus, the bias of the deselected row may be matched to the reduced selected column bias or voltage B. In some embodiments, the read strobe can be asserted at this time and a zero bias scheme in a memory array using an ovonic threshold switch can be achieved without leakage to a deselected cell on the selected column, in some embodiments.

Figure 6:
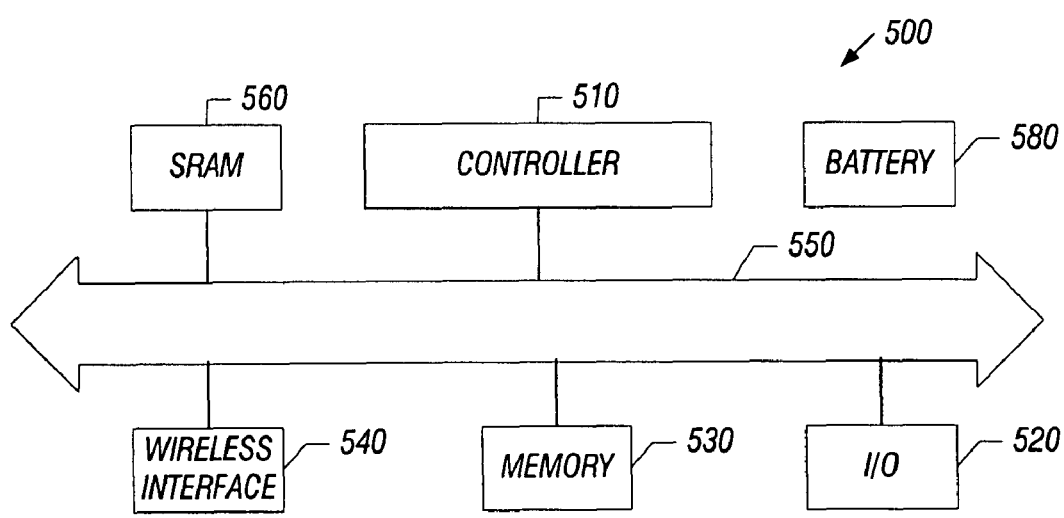
FIG. 6 is a system depiction in accordance with one embodiment of the present invention.

Turning to FIG. 6, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, a wireless interface 540, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, and/or memory 10 illustrated in FIG. 1.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well. While chalcogenides are discussed, pnictides may also be used, such as GeSb.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    reading a phase change memory array of rows and columns of cells, each cell including an ovonic threshold switch and a storage device by applying a first voltage to a selected column and, after applying said first voltage, applying a second voltage lower than said first voltage to said selected column and to a deselected row.

2. The method of claim 1 wherein said first voltage is sufficient to threshold the ovonic threshold switch when the storage device is in the set state.

3. The method of claim 2 including using a second voltage that corresponds to the holding voltage of the ovonic threshold switch.

4. The method of claim 3 including applying said first and second voltages to a bitline.

5. The method of claim 1 including applying a first voltage sufficient to exceed the sum of the threshold voltage of the ovonic threshold switch and the voltage dropped by the storage device.

6. A phase change memory comprising:
    an array including rows and columns of phase change memory cells; and
    a read circuit to apply a first voltage to a selected column and thereafter to apply a second voltage lower than said first voltage to said selected column and to a deselected row.

7. The memory of claim 6 wherein said cells include an ovonic threshold switch in series with a phase change storage device.

8. The memory of claim 7, said read circuit to apply a first voltage sufficient to threshold the ovonic threshold switch when the storage device is in the set state.

9. The memory of claim 8, said read circuit to apply a second voltage that corresponds to the holding voltage of the ovonic threshold switch.

10. The memory of claim 9, said read circuit to apply said first and second voltages to a bitline of a selected cell.

11. The memory of claim 10, said read circuit to apply said first voltage of sufficient amplitude to exceed the sum of the threshold voltage of the ovonic threshold switch and the voltage drop by the storage device.

12. A system comprising:
    a processor;
    a battery; and
    a phase change memory coupled to said processor including an array having a plurality of phase change memory cells and rows and columns, said cells coupled to said rows and columns, and a read circuit to apply a first voltage to a selected column and thereafter, to apply a second voltage lower than said first voltage to said selected column and to a deselected row.

13. The system of claim 12 wherein said cells include an ovonic threshold switch in series with a phase change storage device.

14. The system of claim 13, said read circuit to apply a first voltage sufficient to threshold the ovonic threshold switch when said storage device is in the set state.

15. The system of claim 14, said read circuit to apply a second voltage that corresponds to the holding voltage of the ovonic threshold switch.

16. The system of claim 15, said read circuit to apply said first and second voltages to a bitline of a selected cell.

17. The system of claim 16, said read circuit to apply said first voltage of sufficient amplitude to exceed the sum of the threshold voltage of the ovonic threshold switch and the voltage drop by the storage device.

* * * * *